United States Patent [19]

Bisson et al.

[11] Patent Number: 4,573,012
[45] Date of Patent: Feb. 25, 1986

[54] METHOD AND APPARATUS FOR MEASURING CORE LOSS OF A LAMINATED FERROMAGNETIC STRUCTURE

[75] Inventors: Donald K. Bisson; Steven A. Nardin, both of Fort Wayne, Ind.

[73] Assignee: General Electric Company, Schenectady, N.Y.

[21] Appl. No.: 465,830

[22] Filed: Feb. 14, 1983

[51] Int. Cl.⁴ ............................................ G01R 33/14
[52] U.S. Cl. .................................. 324/222; 324/225; 324/240
[58] Field of Search ................ 324/222, 223, 59, 226, 324/228, 230, 233, 234, 236, 237, 238, 239, 240, 241, 225

[56] References Cited

U.S. PATENT DOCUMENTS

| | | |
|---|---|---|
| 675,518 | 6/1901 | Merrick . |
| 1,022,023 | 4/1912 | Foster . |
| 2,282,283 | 5/1942 | Henter . |
| 3,171,996 | 3/1965 | Alger et al. . |
| 3,588,683 | 6/1971 | Lloyd .............................. 324/241 X |
| 3,899,733 | 8/1975 | Osborn et al. ....................... 324/222 |
| 4,044,302 | 8/1977 | Mayberry ...................... 324/239 X |
| 4,301,386 | 11/1981 | Schweder et al. . |
| 4,335,352 | 6/1982 | Stephen ......................... 324/239 X |

FOREIGN PATENT DOCUMENTS

| | | | |
|---|---|---|---|
| 47-42352 | 10/1972 | Japan .................................... | 324/223 |
| 437990 | 2/1975 | U.S.S.R. ............................. | 324/239 |

OTHER PUBLICATIONS

Blundell, et al., "A New Method of Measuring Power Loss of Magnetic Materials Under Sinusoidal Flux Conditions", Journal of Magnetism and Materials, vol. 19, No. 1-3, Apr. 11, 1980, pp. 243-244.

Myrgren, "Computer Controlled Measuring System for Ring Specimen", Journal of Magnetism and Materials, vol. 19, No. 1-3, Apr. 11, 1980, pp. 235-239.

ASTM Standards: Alternating Current Magnetic Properties of Laminated Core Specimens (A'346-64), pp. 94-121.

ASTM Standards: Electrical and Mechanical Properties of Magnetic Materials (A'344-68), pp. 77-88.

ASTM Standards: Definitions of Terms, Symbols, and Conversion Factors Relating to Magnetic Testing, (A340-65), pp. 13-32.

ASTM Standards: Alternating Current Magnetic Properties of Materials Using Epstein Specimens (A 343-60T), pp. 29 et seq.

Primary Examiner—Gerard R. Strecker
Assistant Examiner—Warren S. Edmonds
Attorney, Agent, or Firm—Robert A. Cahill

[57] ABSTRACT

A core loss tester employs separate cables for excitation and pickup. Testing is performed at a fixed flux density in the ferromagnetic core. A processing circuit on the output of the pickup coil scales the voltage developed so that, when excitation current is increased so that the indicated output of the pickup coil equals the effective cross-sectional area of the flux path, the fixed predetermined value of flux density is produced. When this condition is achieved, the excitation current times the sensed flux-induced voltage provides a measurement of the core loss in watts. Excitation is accomplished with a multi-conductor cable looped once or more times through the core with the conductors in the cable connected in series by mating together of a connector at each end.

10 Claims, 13 Drawing Figures

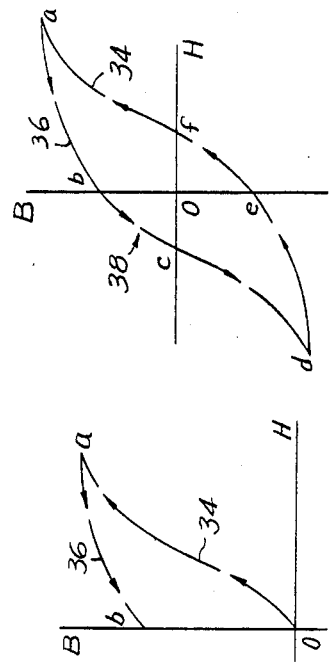
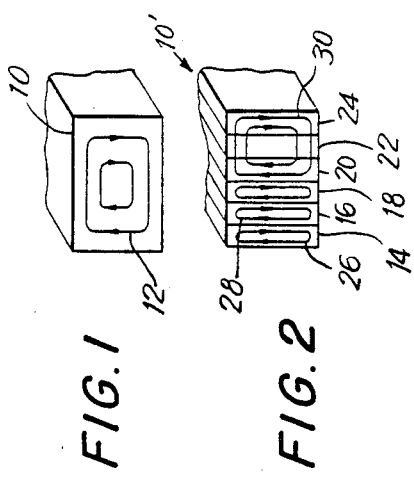
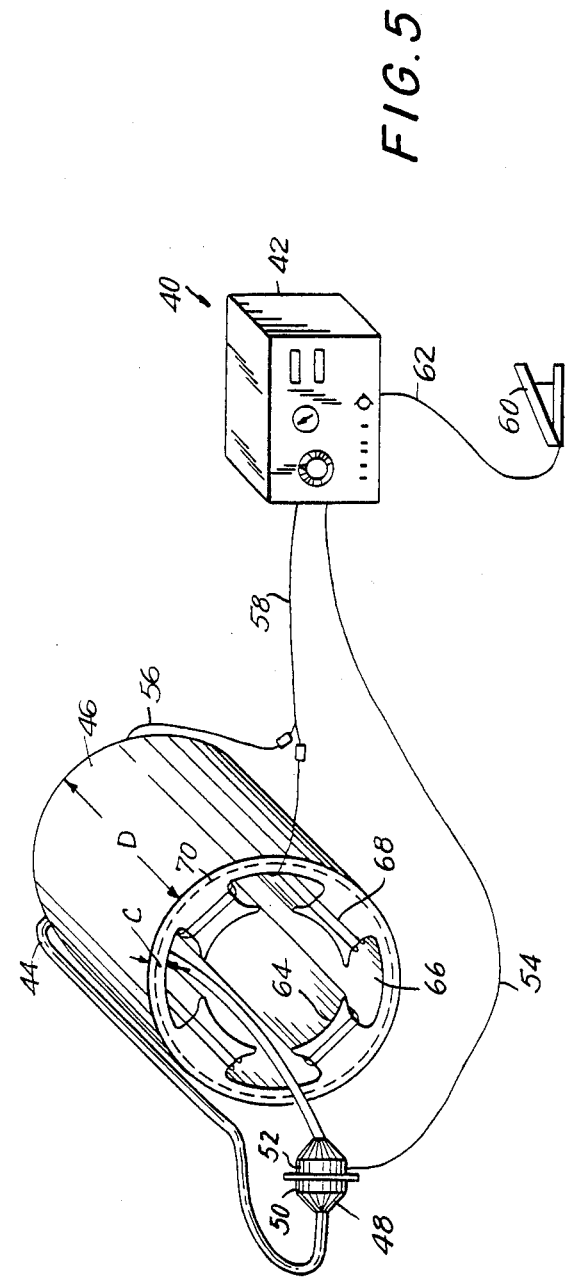

METHOD AND APPARATUS FOR MEASURING CORE LOSS OF A LAMINATED FERROMAGNETIC STRUCTURE

The present invention relates to test apparatus and, more particularly, to test apparatus for testing losses in the ferromagnetic material of a core.

During manufacture and refurbishing of transformers and electrodynamic machinery, it is useful, and sometimes vital, to be able to assess the power losses which the core may impose. Such power losses typically occur due to the employment of materials having a wide hysteresis loop as well as to insulation breakdown between lamella in a laminated core. Such insulation breakdown, of course, leads to increased eddy current losses.

Core testers depend, for meaningful indication, on the application of an AC signal which produces a predetermined level of flux density in the core. Conventionally, a pickup coil produces a signal proportional to the total flux in a core and the operator divides this value by the effective cross-sectional core area to determine the flux density. This flux density multiplied by a factor related to the ampere turns applied to the core by an exciting coil is employed to calculate the core loss in watts. This procedure is computationally difficult and consequently is subject to error.

OBJECTS AND SUMMARY OF THE INVENTION

Accordingly, it is an object of the invention to provide a core loss tester which overcomes the drawbacks of the prior art.

It is a further object of the invention to provide a core loss tester which permits simple and direct measurement of power loss in a ferromagnetic core which is simpler to perform and less subject to computational error than the prior art.

It is a further object of the invention to provide a core loss tester in which a control or adjustment output is scaled to equal an effective cross-sectional area of the flux path in the core under test. An excitation level is adjusted until an indication equal to the core cross-sectional area is achieved and the core loss in watts may be read off.

According to an aspect of the present invention, there is provided a tester for measuring electrical losses in a flux path of a ferromagnetic structure, the flux path having an effective cross-sectional area, comprising a first coil adapted for coupling to the structure, means for exciting the first coil with an alternating current having an amplitude whereby a magnetic flux is produced in the flux path, a second coil adapted for coupling to the structure and for producing a flux signal in response to the magnetic flux in the flux path, means for scaling the flux signal to produce an area voltage related to a fixed value of flux density in the flux path and the effective cross-sectional area, first means for indicating the area voltage scaled in units of area, means for multiplying a signal related to the amplitude by a signal related to the flux signal to produce a power loss signal, second means for indicating the power loss signal, and means for adjusting the alternating current until the first means for indicating produces an indication equal to the cross-sectional area, whereby a condition for reading the power loss indication on the second means for indicating is produced.

According to a further aspect of the present invention, there is provided a core loss tester for testing power loss in a flux path in a core, comprising a first coil adapted for making at least one turn about the core, a second coil adapted for making at least one turn about the core spaced from the first coil, a variable transformer connectable to the first coil for applying an alternating current thereto, means for producing a current signal in response to the alternating current, means for producing a flux signal responsive to a magnetic flux in the core encircled by the at least one turn of the second coil, a multiplier effective for multiplying the current signal by the flux signal to produce a core loss signal, an absolute value circuit effective to produce a DC signal proportional to an average of an absolute value of the flux signal, and a voltage having a predetermined magnitude per unit effective cross-sectional area of the flux path when a fixed predetermined flux density exists in the flux path.

According to a feature of the present invention, there is provided a method for measuring electrical losses in a flux path of a ferromagnetic structure, the flux path having an effective cross-sectional area, comprising coupling a first coil to the structure, exciting the first coil with an alternating current having an amplitude whereby a magnetic flux is produced in the flux path, coupling a second coil to the structure, the second coil being adapted for producing a flux signal in response to the magnetic flux in the flux path, scaling the flux signal to produce an area voltage related to a fixed value of flux density in the flux path and the effective cross-sectional area, indicating the area voltage scaled in units of area, multiplying a signal related to the amplitude by a signal related to the flux signal to produce a power loss signal, indicating the power loss signal, adjusting the alternating current until the area voltage equals the cross-sectional area, and reading the power loss indication.

According to a further feature of the present invention, there is provided a core loss tester, comprising first and second coils adapted for coupling to the core, a transformer connectable to apply a controllable AC voltage to the first coil, means for measuring a voltage induced in the second coil by magnetic flux in the core, means for measuring a power loss in the core related to the current and the voltage, a plurality of first relay contacts effective to connect the first and second coils in series, a second relay coil energizable only by voltage in series through the plurality of first relay contacts and the first and second coils, second relay contacts in series with a first relay coil and effective when the second relay coil is energized to enable energizing the first relay coil, the first relay coil being effective when energized to switch the plurality of first relay contacts into positions which connect the AC voltage to the first coil and the means for measuring a current to the second coil, and a switch in series with the first relay coil, the switch being closed only when the transformer is controlled to produce zero AC voltage whereby a test can be started only at zero AC voltage after continuity of the first and second coils is achieved.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 1 is a schematic cross-sectional view of a unitary conductor showing an eddy current path.

FIG. 2 is a schematic view of a conductor composed of lamella, some of which are insulated from each other and others of which exhibit insulation breakdown which permits eddy currents to flow.

FIG. 3 is a graph to which reference will be made in explaining hysteresis losses.

FIG. 4 is a further diagram to which reference will be made in explaining hysteresis losses.

FIG. 5 is a schematic perspective view of a core under test by a core tester according to an embodiment of the invention.

DETAILED DESCRIPTION OF THE PREFERRED EMBODIMENT

Figure 6:
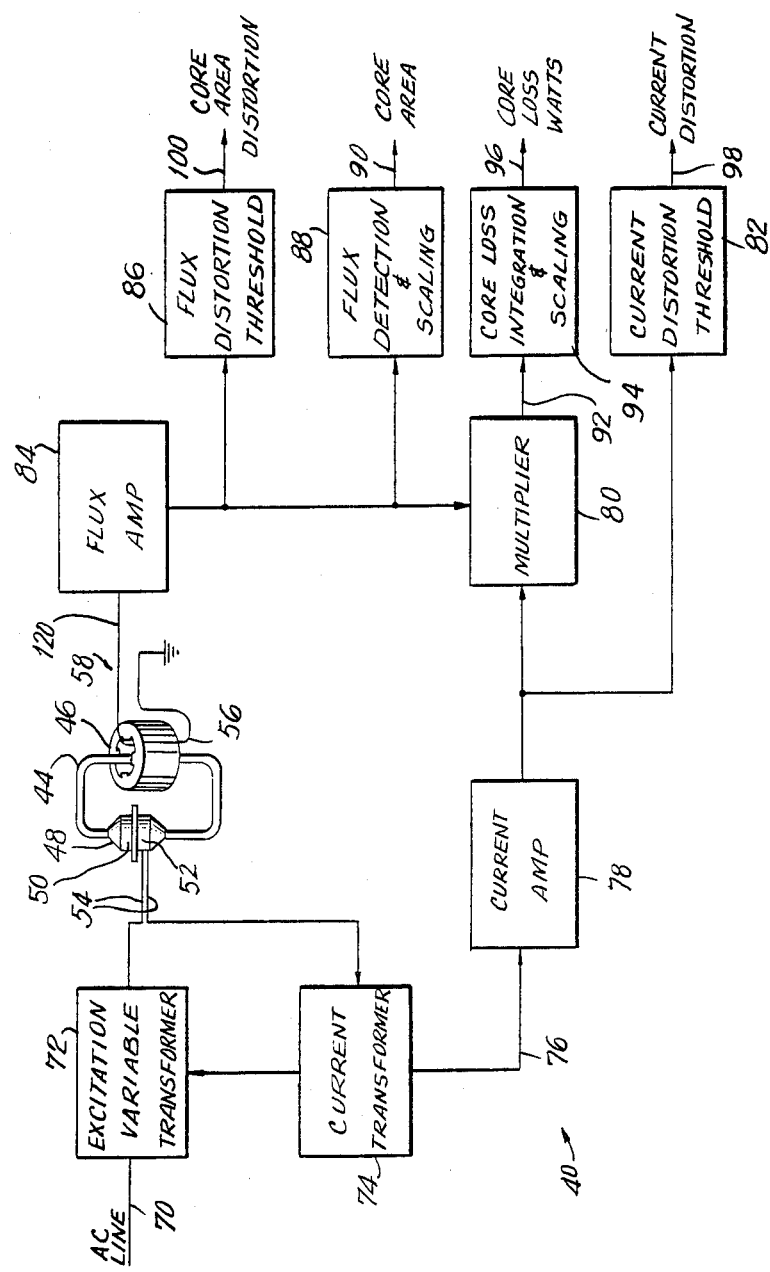
FIG. 6 is a simplified block diagram of an embodiment of a core tester according to an embodiment of the invention.

The efficiency of electric transformers and electrodynamic machines such as, for example, generators and motors, depends to a large extent on the characteristics of the ferromagnetic material of which the core is composed. The two principal sources of power loss in cores are eddy currents and hysteresis losses.

Referring first to FIG. 1, there is shown a cross section of a conductor 10 which is exposed to a magnetic flux resulting in the generation of circulating currents indicated by closed rectangles 12. The power dissipation in conductor 10 is equal to $I^2R$. For most ferromagnetic materials, eddy current losses severely limit the power which the apparatus can handle due to the heat generated in the material. A conventional approach to the reduction of eddy current losses is the use of thin laminations of ferromagnetic material such as the laminations 14, 16, 18, 20, 22 and 24 in FIG. 2 which make up a mass of ferromagnetic material 10' having essentially the same magnetic properties as conductor 10 in FIG. 1. Laminations 14–24 are designed to be electrically insulated from each other either by an oxide coating on abutting surfaces or, more conventionally, by a layer of varnish on their surfaces. When thus properly insulated, such as is the case between laminations 14 and 16, an eddy current 26 in lamination 14 is restricted to this lamination and is prevented from conduction into adjacent lamination 16. As a consequence, eddy current 26 travels a relatively long path which has a substantial resistance and, therefore, dissipates less power and generates less heat.

If a breakdown in the insulation between laminations occurring due to faulty varnish, overheating during use or maintenance, or destruction by arcing or mechanical abuse, adjacent laminations can become electrically connected such as illustrated in laminations 20, 22 and 24 wherein an eddy current loop 30 shares these laminations. Such an insulation breakdown, of course, increases the losses due to the shortened eddy current paths involved.

Breakdown in the insulation between lamination such as shown in FIG. 2 can occur due to manufacturing defects or mishandling during manufacture or heat, arcing or mechanical abuse during use. In addition, when a motor is stripped of its windings and rewound, damage to the insulation may also occur.

Referring now to FIG. 3, when a mass of ferromagnetic material, initially unmagnetized, is exposed to a magnetic intensity H, the flux density B in the ferromagnetic material increases along a line 34 from 0 to a maximum at a point a. When the magnetic intensity H is again reduced to 0, the flux density B is not reduced to 0 but, instead, is reduced along a line 36 from point a to point b. Thus with magnetizing current and the resulting magnetic intensity H reduced to 0, the flux density B remains at a non-zero level b. That is, the ferromagnetic material "remembers" the prior magnetization.

Referring now to FIG. 4, if the ferromagnetic material is repetitively exposed to negative and positive alternations of magnetic intensity H, the resulting flux density in the ferromagnetic material follows the path a, b, c, d, e. f and returns to a. This figure is a hysteresis loop 38. Hysteresis results in the dissipation of power and the production of heat within the ferromagnetic material each time the material is caused to traverse its hysteresis loop. A desirable ferromagnetic material has a high magnetic permeability with a small hysteresis loss. Modern cores employ silicon steel for this purpose which exhibits a hysteresis loss of only one-third to one-quarter as much as is experienced with cores made with less desirable materials.

A field or shop evaluation of core efficiency preferably accounts for both eddy current and hysteresis losses. We have discovered that, if a fixed predetermined value of flux density is produced in a core, it is possible to consistently measure the core losses involved in producing the fixed level of flux density.

Referring now to FIG. 5, there is shown, generally at 40, a core loss tester according to an embodiment of the invention which permits straightforward and simplified testing of existing cores for both eddy current and hysteresis losses. A cabinet 42 contains the electronic excitation and analysis circuits, to be more fully described hereinafter. A multi-conductor primary or excitation coil 44 is looped in one or more turns through and around a cylindrical core 46 to be tested. Primary coil 44 includes a plurality of conductors 48 such as, for example, 30 conductors terminating at one end in a jack 50 and at the other end in a plug 52. Jack 50 and plug 52 are poled and wired so that, when mated, all of wires 48 are placed in series with a pair of wires 54 between cabinet 42 and plug 52.

A single-turn secondary or sense winding 56 is looped through and around core 46 and is connected by a pair of wires 58 to cabinet 42. Although it may not be necessary for accurate measurement, we have found the repeatability of measurements to be enhanced when primary coil 44 and secondary coil 56 are symmetrically placed 180° apart on core 46 and are dressed for tight coupling to core 46.

A foot pedal switch 60 is connected to cabinet 42 by a pair of wires 62.

Core 46 is simplified for purposes of illustration to a structure built up of laminations stacked along the direction of axial length dimension D and including four pole pieces 64 separated by winding slots 66 in which windings 68 are disposed. The flux path between primary coil 44 and secondary coil 56, indicated by a dashed line 70 is essentially limited by the cross section C from the base of winding slots 66 to the outer diameter of core 46 and the depth or axial length D or core 46. Pole pieces 64 have little effect on the flux path and can be ignored. That is, flux path 70 traverses a cross-sectional area made up of the individual lamination cross-sections which is approximately equal to cross section C times depth D. This area must be corrected by a stacking factor to account for the thickness of insulating varnish between the laminations and also by the width of any cooling slots which may be employed; such cooling slots being in the form of circumferential openings created by spacers interposed between sets of laminations, as is well known in the art. Stacking factors of about 0.97 may be employed for motor stators of from about 5 to about 200 horsepower and stacking factors of about 0.95 may be employed for motors of more than 200 horsepower. Arriving at a particular stacking factor as largely an emphirical judgement based on the method of manufacture, the type of lamination insulation, and the lamination clamping force. Thus, the cross-sectional area traversed by flux path 70 is:

$$A = (D-S) \times C \times F$$

Where:
A = effective cross-sectional area of flux path
D = depth of core
S = cooling slot width
C = core thickness
F = stacking factor (0.97 for 5–200 HP, 0.95 for 200+HP)

The above expression for flux path cross-sectional area is a basic input to the operation of core loss tester 40.

Referring now to FIG. 6, a simplified functional block diagram of core loss tester 40 is shown. To briefly summarize the operation, an exciting current to primary coil 44 is increased until a predetermined level of flux density is achieved in secondary coil 56. The power consumed at this condition is then measured to determine the core loss.

In more detail now, AC power on an AC line 70 is applied to a variable transformer 72 which, in turn, feeds one conductor of wires 54 thus feeding a controlled AC voltage to primary coil 44. Return current from primary coil 44 is fed back through a current transformer 74 to variable transformer 72.

Current transformer 74 feeds a voltage proportional to the current through it on a line 76 to a current amplifier 78. Current amplifier 78 includes means for selecting a gain and for trimming an offset as will be described and feeds the resulting signal to one input of a multiplier 80 and to the input of a current distortion threshold 82.

A voltage induced in secondary coil 56 by the flux in core 46 is fed on a pair of wires 58 to a flux amplifier 84. Flux amplifier 84 includes provision for selecting one or more values of gain and provides for trimming an offset voltage. The output of flux amplifier 84 is applied to a second input of multiplier 80 as well as to a flux distortion threshold 86 and a flux detection and scaling circuit 88. An output of flux detection and scaling circuit is applied on a line 90 to a measurement device such as, for example, a voltmeter (not shown).

The voltage developed in secondary coil 56 is proportional to the total flux in the flux path. As previously noted, the measurement of core loss is made at a predetermined value of flux density expressed, for example, as lines per inch, webers per square meter or maxwells per square meter. For purposes of description, and not as a limitation, it is assumed that the desired flux density is equal to one Tesla which is equal to one weber per square meter, or 64.5 kilolines per square inch.

The basic secondary voltage equation is:

$$V = 4.444 \times B \times A \times N \times f \times 10^{-8}.$$

Thus, the voltage output of a single turn secondary coil 56 (N=1) at a frequency of 60 Hertz (f=60) is expressed as follows:

$$V = 2.666 \times 10^{-6} B \times A$$

Where:
V = voltage output of secondary coil (for single turn coil)
B = flux density
A = effective cross-sectional area of flux path (previously defined)

If a desired flux density of 64.5 kilolines per square inch (one Tesla) is employed, then a voltage of 0.1720 volts per square inch of effective cross-sectional area of flux path is produced. Flux detection and scaling circuit 88 contains circuits which produce an output on line 90 which can be directly indicated in terms of area. Thus, in order to test a core 46, the operator is required only to calculate the effective cross-sectional area of the flux path A and then increase the excitation voltage applied to primary coil 44 until the indicator receiving the signal on line 90 indicates the number of square inches or square centimeters equal to the effective cross-sectional area of the flux path. At that point, the inputs to multiplier 80 provide an output on a line 92 to a core loss integration and scaling circuit 94 which thereupon produces an output signal on a line 96 indicating the core losses in watts.

Accurate measurement of AC quantities in core loss testor 40 requires that core 46 and the measurement circuits be operating on AC power at the fundamental frequency on AC line 70. With sinusoidal inputs and outputs, the peak voltage of a pure sine wave is 1.414 times the RMS value. If amplifiers are saturated on the peaks of the excitation signal, the flat topping of the sine-wave input produces predominantly third harmonic distortion. Third harmonic distortion, added to the fundamental, is no longer related to the RMS value by the factor 1.414. The third harmonic distortion produces a crest factor which may be two or three times the RMS value. The crest factor is defined as the ratio of the instantaneous peak voltage to the RMS value.

In order to avoid accepting measurements which are incorrect due to third harmonic distortion, current distortion threshold 82 and flux distortion threshold 86 sense the existence of instantaneous voltages produced by third harmonic distortion and provide alarm outputs on lines 98 and 100 to alert an operator to this fact and to thereby enable range adjustment to eliminate amplifier overloading.

Figure 7:
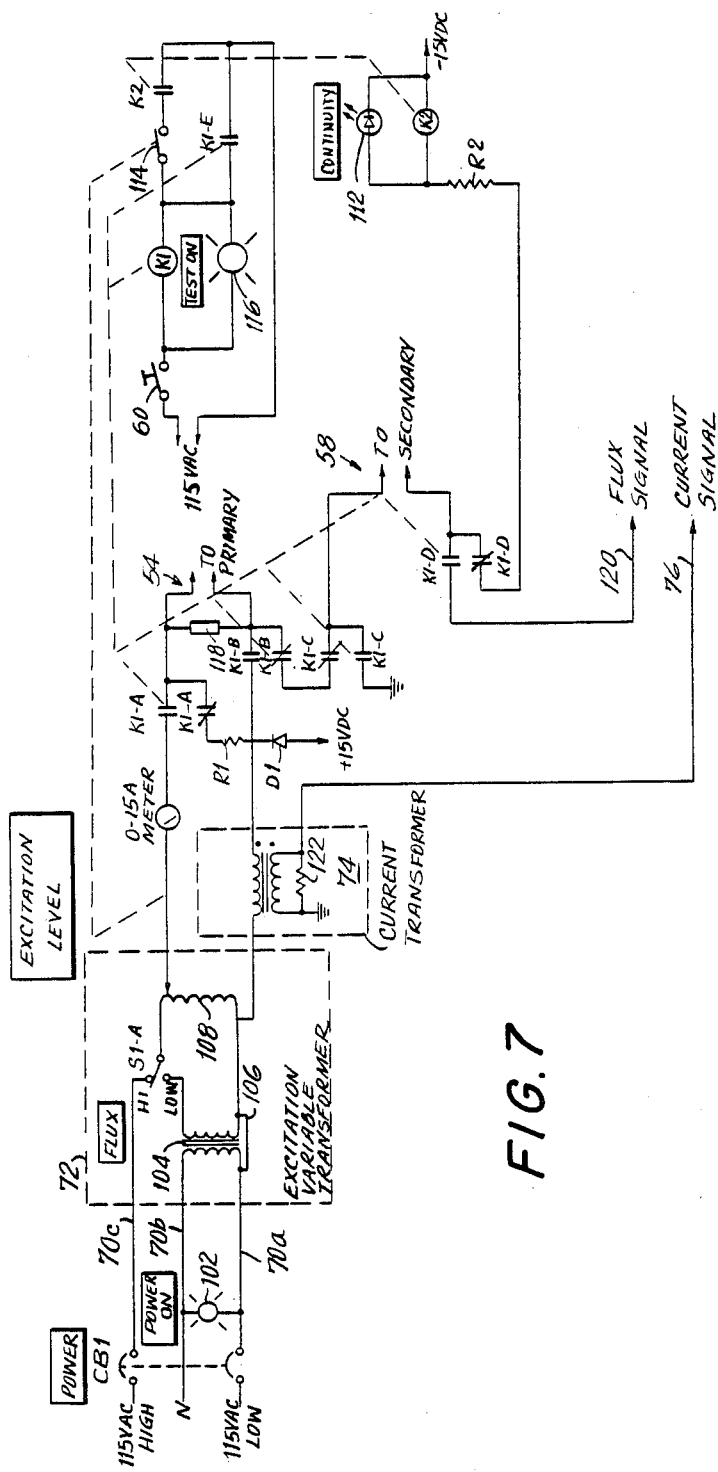
FIG. 7 is a detailed schematic diagram of a portion of the core tester of FIG. 6.

Referring now to FIG. 7, AC line 70 is seen to consist of a 115 VAC low line 70a, a neutral 70b and a high 70c with a power circuit breaker CB1 for switching low and high lines 70a and 70c. A POWER ON indicator 102 may be provided to indicate this condition. The arrangement shown is suitable for 220 volt single phase. If 115 volt single phase is the only power available, lines 70b and 70c may be jumpered. A transformer 104 has its primary connected across lines 70a and 70b. A jumper 106 interconnects one side of the primary and secondary of transformer 104. The jumpered side of the secondary of transformer 104 is connected to one end of a variable transformer 108. The other end of the secondary of transformer 104 is connected to a LO terminal of a multi-section FLUX switch S1-A. The HI terminal of FLUX switch S1-A is connected to AC line 70c. The movable terminal of FLUX switch S1-A is connected to the other end of variable transformer 108.

The slider or movable terminal of variable transformer 108 is connected through a current meter to a normally open terminal K1-A of a relay. The fixed end of variable transformer 108 is connected through a primary winding of current transformer 74 to a normally open relay contact K1-B.

Relay K1, together with a diode D1, resistors R1 and R2 and continuity indicator 112 comprise an automatic continuity test circuit which is effective each time a test is attempted. If there is a failure of continuity due to faulty connection to either primary or secondary coil 44 or 56 or other continuity failure, further testing is inhibited until continuity is achieved. In the pre-test condition shown, plus 15 volts is fed along the path diode D1, resistor R1, normally closed contacts K1-A, wires 54 in series through all turns of primary coil 44, normally closed contact K1-B, normally closed contacts K1-C, wires 58 and secondary coil 56 (FIG. 5), normally closed contacts K1-D, resistor R2, and continuity indicator 112 to minus 15 volts. This also places energizing voltage across a coil of relay K2. When continuity is thus achieved, a normally open contact of relay K2 is closed.

A switch 114 is mechanically coupled to the movable contact of variable transformer 108 to be closed only when variable transformer 108 is at its zero voltage or off condition. Switch 114 is connected in series from one terminal of normally open relay contact K2 and one terminal of the coil of relay K1. The other terminal of relay K1 is connected to a terminal of normally open foot pedal switch 60. The other terminal of foot pedal switch 60 is connected to a 115 VAC line. The other 115 VAC line is connected to the other terminal of normally open relay contact K2. This last-mentioned 115 VAC line is also connected to a normally open relay contact K1-E. The other terminal of relay contact K1-E is connected to the junction of switch 114 and relay coil K1. A TEST ON indicator 116 is connected across relay coil K1.

A transient voltage suppression RC network 118 is connected across wire 54. Normally open contact K1-C, when closed, connects one of wires 58 to ground. Normally open relay contact K1-D, when closed, connects the other of wires 58 to a line 120. The secondary of current transformer 74 is shunted by a low value resistor 122 having a resistance of, for example, 0.1 ohms. One terminal of the secondary is grounded. A voltage developed across resistor 122 is applied to line 76.

When continuity is achieved on the path previously described, continuity indicator 112 is illuminated and relay K2 is energized. This closes normally open relay contact K2. Before a test can begin, variable transformer 108 must be set to its low or zero condition so that switch 114 is closed to thus connect one side of the 115 VAC line to one terminal of relay coil K1. In this condition, when foot pedal switch 60 is closed, relay coil K1 is energized and the open and closed conditions of relay contacts K1 are reversed. This includes normally open relay contact K1-E which bypasses normally open relay contact K2 and switch 114. The reversal of contacts of relay K1 break the signal previously energizing relay K2 and open the normally open relay contact K2. However, due to the closing of normally open relay contact K1-E, relay K1 remains energized as long as foot pedal switch 60 remains closed. Similarly, when switch 114 is opened by the adjustment of variable transformer 118 to provide a non-zero output, there is no change in the energization of relay K1 due to the bypassing of this switch by normally open relay contacts K1-E. When relay K1 is energized, TEST ON indicator 116 is illuminated to indicate this fact. Also, when continuity to relay coil K2 is broken, CONTINUITY indicator 112 is extinguished.

Transformer 104 provides a fixed lower AC voltage at its secondary which substitutes for the available 220 VAC line voltage. Transformer 104 may have any convenient output voltage such as, for example, 24 volts. The lower voltage output of transformer 104 is selected when testing cores having a low effective cross-sectional area of flux path such as, for example, areas of less than 4.5 square inches. This permits adequate resolution of adjustment of variable transformer 108. Other sections of switch S1 (not shown in FIG. 7) change the gain of flux amplifier 84 (FIG. 6) and correspondingly re-scale measurement devices as will be explained hereinafter.

Figure 8:
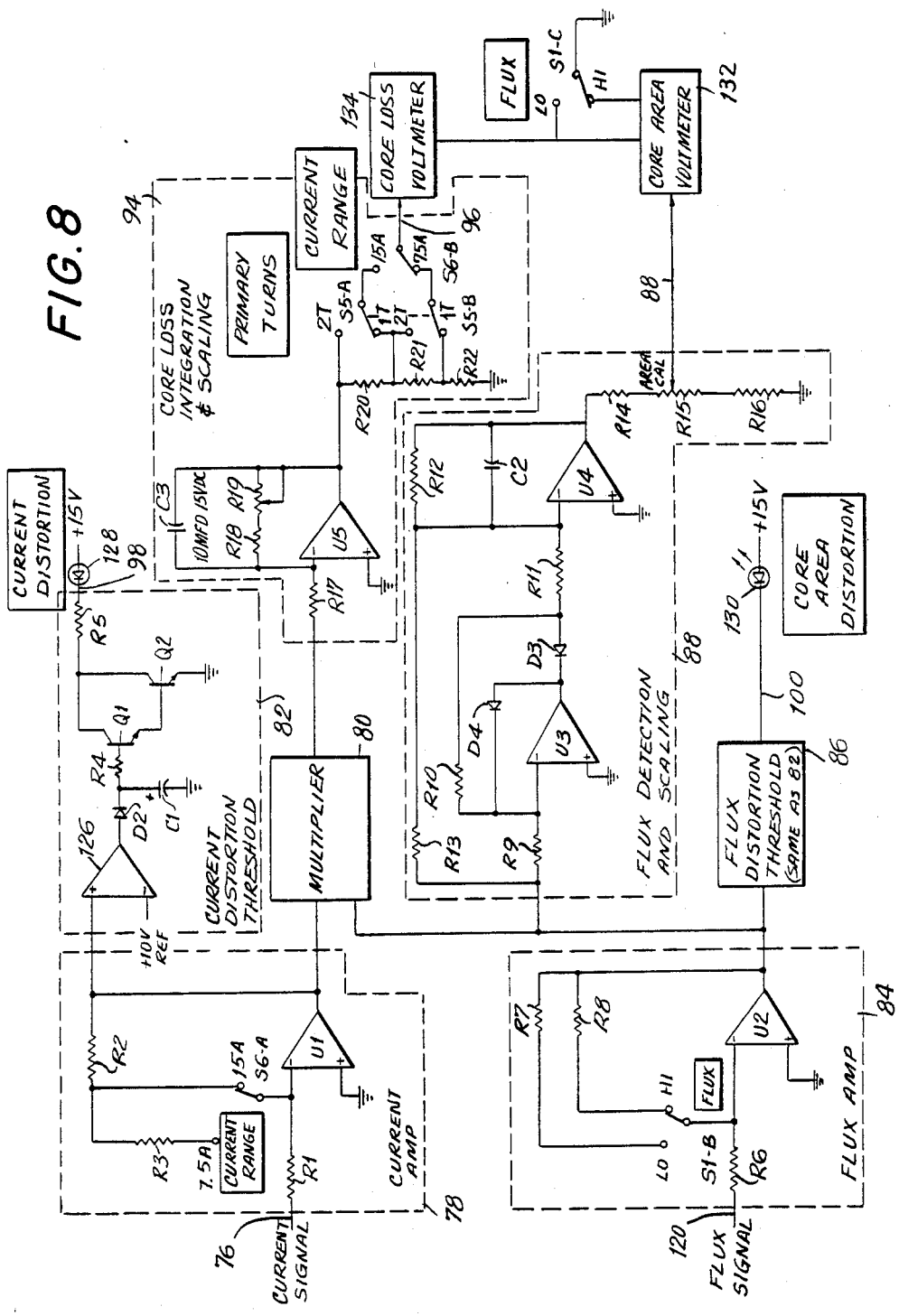
FIG. 8 is a detailed schematic and logic diagram of a further portion of the core tester of FIG. 6.

Referring now to FIG. 8, the current signal on line 76 is applied through an input resistor R1 to a minus input of an operational amplifier U1 in current amplifier 78. The plus input of operational amplifier U1 is grounded. A feedback resistor R2 is connected back to a 15A terminal of a CURRENT RANGE switch S6-A and to one terminal of a resistor R3. The other terminal of resistor R3 is connected to a 7.5A terminal of CURRENT RANGE switch S6-A. As is well known, the gain of an operational amplifier connected as shown is equal to the ratio of its feedback resistor to its input resistor. By properly proportioning resistors R2 and R3, the gain of operational amplifier U1 can have any desired relationship when CURRENT RANGE switch S6-A is switched between its 7.5A and 15A positions. In the preferred embodiment, resistors R2 and R3 are equal whereby the output of operational amplifier U1 is twice as great when CURRENT RANGE switch S6-A is in its 7.5A position as compared to when it is in its 15A position. Conventional offset trimming inputs (not shown) may be provided.

The output of operational amplifier U1 is applied to one input of multiplier 80 and to a plus input of a comparator 126. Comparator 126 also receives a plus 10 volt reference voltage at its minus input. The output of comparator 126 is applied through a diode D2 to an input of a storage capacitor C1 whose other terminal is grounded. The voltage stored in capacitor C1 is applied through a resistor R4 to the base of a transistor Q1 which forms one element of a Darlington pair with a transistor Q2. A resistor R5 is connected between the coupled collectors of transistors Q1 and Q2 and line 98. A CURRENT DISTORTION indicator 128 is connected on line 98 between resistor R5 and a plus 15 volt source.

When the output of operational amplifier U1 exceeds about plus 10 volts, comparator 126 provides a positive signal through diode D2 which is stored in capacitor C1. This energizes the Darlington pair Q1, Q2 and energizes CURRENT DISTORTION indicator 128. This occurs, as previously noted when flat topping of the signal due to overdrive produces third harmonic distortion having a relatively high crest factor. In order to correct this condition, CURRENT RANGE switch S6-A can be placed in the lower gain 15A position. If this correction is not sufficient to avoid current distortion, primary coil 44 (FIG. 5) may be looped for two turns through the core provided that enough length is available. If two turns are employed, appropriate change in meter scaling must be performed as will be explained.

The flux signal on line 120 is applied through an input resistor R6 to a minus input of an operational amplifier U2 in the flux amplifier 84. Two feedback resistors R7 and R8 are selectable between the output of operational amplifier U2 and its minus input by FLUX switch S1-B. Resistor R7 is connected to the LO terminal of FLUX switch S1-B and resistor R8 is connected to the HI terminal of FLUX switch S1-B. The relationship between the resistances of feedback resistors R7 and R8 should be the same as the relationship between the voltage from transformer 104 (FIG. 7) and the line voltage. If this voltage relationship is in a factor of 10, then the relationship between resistors R7 and R8 should also be a factor of 10. In the preferred embodiment, for example, wherein transformer 104 has an output of 24 volts, resistor R7 has a resistance of 30K ohms and resistor R8 has a resistance of 3K ohms.

The output of operational amplifier U2 is applied to a second input of multiplier 80 as well as to inputs of flux detection and scaling circuit 88 and flux distortion threshold 86. Flux detection and scaling circuit 88 detects and integrates the AC flux signal and scales it so that a scaled output has a fixed relationship to the effective cross-sectional area of the flux path. Preferably, this fixed relationship is a voltage which is equalled to the cross-sectional area in square inches. That is, a two-volt output signal corresponds to an effective cross-sectional area of flux path of two square inches.

Flux distortion threshold 86 functions identically to current detection threshold 82 to provide a signal on line 100 which indicates the presence of third harmonic distortion by illumination of a CORE AREA DISTORTION indicator 130.

Flux detection and scaling circuit 88 provides a DC signal proportional to the absolute value of the AC flux signal at its input. A first stage operational amplifier U3 has a gain of one due to its input and feedback resistors R9 and R10 respectively having equal values. A rectifier diode D3 applies the negative half cycles of the output signal to an input resistor R11 feeding the second stage operational amplifier U4. A feedback diode D4 shunts any possible positive output from operational amplifier U3 back to the input. A feedback resistor R12 from output to input of operational amplifier U4 has a resistance which is twice as great as the resistance of resistor R11. A resistor R13 applies the AC flux signal directly to the input of operational amplifier U4. Resistor R13 has the same resistance as resistor R12. Thus, for the AC input signal through resistor R13, operational amplifier U4 has unity gain. Capacitor C2 stores a voltage equal to the average of the absolute value of the AC flux signal.

Figure 9A:
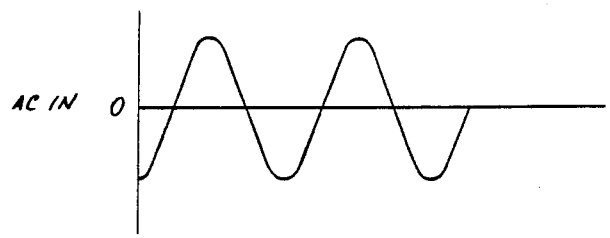
FIGS. 9A–9E are curves to which reference will be made in explaining the operation of the flux detection and scaling circuit of FIG. 8.
Figure 9B:
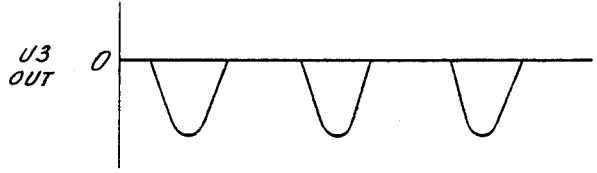
Figure 9C:
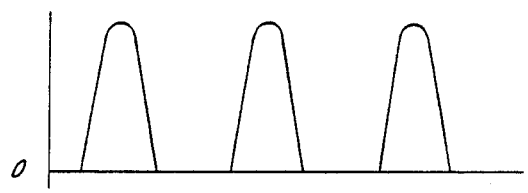
Figure 9D:
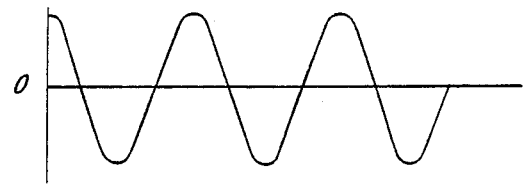
Figure 9E:
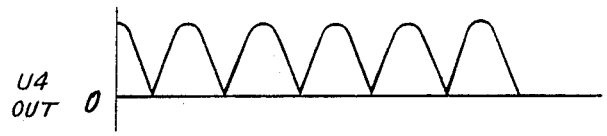

Referring now to FIGS. 9A–9E, the AC input signal, shown in FIG. 9A, is inverted and detected in operational amplifier U3 to provide negative half cycles shown in FIG. 9B. In the absence of an AC input to operational amplifier U4, operational amplifier U4 would produce the signal shown in FIG. 9C as a result of the negative alternations fed to it from operational amplifier U3. It will be noted that the signal in FIG. 9C has twice the amplitude and is inverted with respect to the half cycles of input in FIG. 9B. In the absence of the detected output from operational amplifier U3, the AC signal fed through resistor R13 would produce the output shown in FIG. 9D. By superposition, the signals in FIGS. 9C and 9D can be added to produce the full wave absolute value signal in FIG. 9E. The DC content of this full wave absolute value signal is stored in capacitor C2 (FIG. 8). Resistors R14, R15 and R16 between the output of operational amplifier U4 and ground from a voltage divider which produces an output signal which can be directly indicated on a core area voltmeter 132. Core area voltmeter 132 is calibrated in square inches so that area and flux voltage calculations are unnecessary. That is, when core area voltmeter 132 indicates an area equal to the effective cross-sectional area of the flux path, the flux density in the flux path is at a predetermined value such as, for example, one Tesla (64.5 kilolines per square inch). As previously noted, FLUX switch S1-B changes the gain of operational amplifier U2 in flux amplifier 84 by a factor of 10. A coupled section S1-C of the flux switch correspondingly corrects the indication of core area voltmeter 132 by a factor of 10 so that the indication will remain correct even though the flux signal fed to it has been decimal scaled. Multiplier 80 multiplies the two AC signals at its inputs and produces an output equal to the product. It should be noted that the current signal at the input of multiplier 80 may be scaled by a factor of two by operation of CURRENT RANGE switch S6-A and by a factor of 10 by operation of FLUX switch S1-B. This scaling is removed by subsequent circuits as will be described. The multiplied output of multiplier 80 is applied through an input resistor R17 to a minus input of an operational amplifier U5 in core loss integration and scaling circuit 94. A feedback resistor R18 in series with a variable resistor R19 sets the gain of operational amplifier U5. An integrating capacitor C3 stores the average DC value of the multiplied signal which is thereupon applied to a voltage divider consisting of resistors R20, R21, and R22 from the output of operational amplifier U5 to ground. The taps on the voltage divider are connected to terminals of two sections of a PRIMARY TURNS switch S5-A and S5-B. The voltage divider provides a signal at the junction of resistors R20 and R21 which is equal to one-half of the signal at the output of operational amplifier U5. The voltage at the junction of resistors R21 and R22 is equal to one-quarter of the voltage at the output of operational amplifier U5. The movable contacts of PRIMARY TURNS switch S5-A and S5-B are connected to contacts of a CURRENT RANGE switch S6-B which is a second section of the same switch S6-A in the feedback path of operational amplifier U1 in current amplifier 78. The movable contact of CURRENT RANGE switch S6-B is connected on line 96 to a core loss voltmeter 134 which is calibrated to indicate the core loss in watts.

When two turns of primary coil 44 are employed, the ampere turns and consequent flux density is doubled for a given value of current in primary coil 44. Thus, for a given value of coil current, the indication on core loss voltmeter 134 should be twice as much when two turns are used as compared to one turn. This scaling is effected by PRIMARY TURNS switch S5-A and S5-B. That is, when this switch is in its 2T position, its movable contacts receive twice as much voltage as they do in the 1T position.

CURRENT RANGE switch S6-B selects a voltage from the voltage divider which decompensates or rescales for the change in gain produced by section S6-A of the same switch. That is, when section S6-A is in the 15A position, resulting in half the gain in operational amplifier U1, section S6-B selects twice the voltage for application to core loss voltmeter 134. In the 7.5A position of CURRENT RANGE switch S6-A and S6-B, the gain of operational amplifier U1 is doubled and the voltage fed to core loss voltmeter 134 is halved.

The setting of FLUX switch S1-B for controlling the gain of operational amplifier U2 in flux amplifier 84 proportionately affects the output of multiplier 80. Consequently, FLUX switch S1-C is provided to rescale the output of core loss voltmeter 134 to compensate for this effect. Since the operational amplifier U2 has two different gains as determined by the setting of FLUX switch S1, the output of the voltmeters 132, 134 are rescaled to compensate for such change in gain. This compensation is accomplished by switch S1-C which changes the location of the decimal point in the meter displays.

Having described specific preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

We claim:

1. A tester for measuring electrical losses in a flux path of a ferromagnetic structure, said flux path having a predetermined cross-sectional area, comprising:
   a first coil for coupling to said structure;
   means connectable to said first coil for driving an alternating current therethrough whereby a magnetic flux is produced in said flux path;
   a second coil for coupling to said structure and for producing a flux signal in response to said magnetic flux in said flux path;
   means connectable to said second coil for scaling said flux signal to produce a voltage related to a fixed value of flux density in said flux path and said predetermined cross-sectional area;
   first means connected with said scaling means for indicating said voltage scaled in units of area;
   means responsive to said alternating current for developing a first signal indicative of the amplitude thereof;
   means responsive to said flux signal for developing a second signal indicative of the magnitude thereof;
   means responsive to said first and second signals for multiplying said first signal by said second signal to produce a power loss signal;
   second means responsive to said power loss signal for indicating the power loss in said ferromagnetic structure; and
   means for adjusting said alternating current driving means to vary the amplitude of said alternating current until said first indicating means produces an indication equal to said predetermined cross-sectional area, whereby a condition for reading the power loss indication on said second indicating means is produced.

2. A tester according to claim 1, wherein said first coil includes a plurality of conductors in a cable, a first connector at a first end of said cable, a second connector at a second end of said cable, said first and second connectors being matable together to form a closed loop of said cable and being wired to place all of said plurality of conductors in series.

3. A tester according to claim 1, further comprising a continuity test circuit including means for testing electrical continuity of said first and second coils and means for preventing operation of said tester until said electrical continuity is achieved.

4. A tester according to claim 1, further comprising means responsive to said first and second signals fed to said multiplying means for detecting distortions therein to thereby identify erroneous indications by said first and second indicating means.

5. A tester according to claim 4, wherein said distortion detecting means includes comparator means, said comparator means being responsive to said first and second signals having a predetermined crest factor for detecting said distortions.

6. A tester according to claim 1, further comprising means for permitting coupling at least one of said first and second coils in one of at least a first and second number of turns about said structure and means receiving said power loss signal for scaling the magnitude thereof to compensate for the one of said at least first and second number of turns employed.

7. A tester according to claim 1, wherein said scaling means includes an amplifier stage and means for changing the gain of said amplifier stage to avoid distortion of flux signal, and means for scaling said first indicating means to compensate for the change in stage gain.

8. A core loss tester for testing power loss in a flux path in a core, comprising:
   a first coil for making at least one turn about said core;
   a second coil for making at least one turn about said core spaced from said first coil;
   a variable transformer connectable to said first coil for applying an alternating current thereto;
   first means responsive to said alternating current for producing a current signal indicative of the magnitude thereof;
   second means connectable with said second coil for producing a flux signal responsive to a magnetic flux in said core encircled by said at least one turn of said second coil;
   a multiplier connected to said first and second means for multiplying said current signal by said flux signal to produce a core loss signal;
   an absolute value circuit connected to said second means and effective to produce a DC signal proportional to an average of an absolute value of said flux signal; and
   a voltage divider connected to said absolute value circuit and effective to scale said DC signal to provide an output voltage having a predetermined magnitude per unit of cross-sectional area of said flux path when a fixed predetermined flux density exists in said flux path as established by adjustment of said variable transformer.

9. A method for measuring electrical losses in a flux path of a ferromagnetic structure, said flux path having a predetermined cross-sectional area, comprising:

coupling a first coil to said structure;

exciting said first coil with an alternating current whereby a magnetic flux is produced in said flux path;

coupling a second coil to said structure, said second coil producing a flux signal in response to said magnetic flux in said flux path;

scaling said flux signal to produce a voltage related to a fixed value of flux density in said flux path and said predetermined cross-sectional area;

indicating said voltage scaled in units of area;

adjusting the magnitude of said alternating current until the indication of said voltage equals said predetermined cross-sectional area; and multiplying a signal related to the amplitude of said alternating current by a signal related to said flux signal to produce a power loss signal; and indicating said power loss signal.

10. A core loss tester according to claim 8, which further comprises:

a first relay having a first relay coil and a plurality of first relay contacts effective to connect said first and second coils in series;

a second relay having a second relay coil and second relay contacts, said second relay coil being energizable only by a test voltage applied in series through said plurality of first relay contacts and said first and second coils;

said second relay contacts connected in series with said first relay coil and effective when said second relay coil is energized to enable energizing said first relay coil, said first relay coil being effective when energized to switch said plurality of first relay contacts into positions which connect said varible transformer to said first coil and said second means to said second coil; and a switch in series with said first relay coil, said switch being closed only when said variable transformer is controlled to produce zero alternating current whereby a test can be started only at zero alternating current after continuity of said first and second coils is achieved.

* * * * *